United States Patent
Matsuo (10) Patent No.: US 7,876,168 B2
(45) Date of Patent: Jan. 25, 2011

(54) PIEZOELECTRIC OSCILLATOR AND METHOD FOR MANUFACTURING THE SAME

(75) Inventor: Atsushi Matsuo, Minowa-machi (JP)

(73) Assignee: Epson Toyocom Corporation, Tokyo (JP)

( * ) Notice: Subject to any disclaimer, the term of this patent is extended or adjusted under 35 U.S.C. 154(b) by 118 days.

(21) Appl. No.: 12/332,779

(22) Filed: Dec. 11, 2008

(65) Prior Publication Data

US 2009/0153257 A1      Jun. 18, 2009

(30) Foreign Application Priority Data

Dec. 14, 2007  (JP) ................... 2007-322920
Oct. 21, 2008  (JP) ................... 2008-270607

(51) Int. Cl.
*H03B 5/32* (2006.01)

(52) U.S. Cl. ............... 331/158; 331/68; 331/108 C; 331/116 R (58) Field of Classification Search .......... 331/68, 331/108 C, 116 R, 158; 310/348
See application file for complete search history.

(56) References Cited

U.S. PATENT DOCUMENTS 7,057,331 B2 *   6/2006  Shimodaira et al. ......... 310/344

2001/0024076 A1*  9/2001  Wajima et al. ............. 310/348
2004/0135645 A1*  7/2004  Koyama et al. ............ 331/158
2005/0012559 A1*  1/2005  Shimodaira et al. ........ 331/158
2005/0269910 A1* 12/2005  Homma ..................... 310/348

FOREIGN PATENT DOCUMENTS

| JP | A 2000-196360 | 7/2000 |
| JP | A 2004-15444  | 1/2004 |
| JP | A 2004-228895 | 8/2004 |
| JP | B2 3634676    | 3/2005 |
| JP | A 2006-60638  | 3/2006 |

* cited by examiner

*Primary Examiner*—Joseph Chang
*Assistant Examiner*—Jeffrey Shin
(74) *Attorney, Agent, or Firm*—Oliff & Berridge PLC (57) ABSTRACT

A piezoelectric oscillator includes: a piezoelectric resonator including a container, the container containing a piezoelectric resonator element: and a semiconductor device including an oscillation circuit for vibrating the piezoelectric resonator. The semiconductor device is bonded to a surface of the container. The container has an external coupling terminal and a cut-off part, the external coupling terminal being coupled to the semiconductor device, the cut-off part being disposed on a side surface of the container. The external coupling terminal is disposed in an area of the container, the area being opposed to the semiconductor device, and in the cut-off part. The semiconductor device has a coupling terminal on a surface thereof, the surface being opposed to the container. The coupling terminal of the semiconductor device and the external coupling terminal of the container are coupled with a conductive material.

8 Claims, 5 Drawing Sheets

PIEZOELECTRIC OSCILLATOR AND METHOD FOR MANUFACTURING THE SAME

BACKGROUND

1. Technical Field

The present invention relates to improvements in a piezoelectric oscillator having a structure in which a semiconductor device is bonded to a container of a piezoelectric resonator containing a piezoelectric resonator element, and a method for manufacturing a piezoelectric oscillator.

2. Related Art

A piezoelectric resonator or a piezoelectric oscillator has been widely used in small-size information apparatuses such as hard disk drives (HDDs), mobile computers, and IC cards and mobile communication apparatuses such as cell phones, car phones, and paging systems. A piezoelectric oscillator is formed by bonding together a piezoelectric resonator element made of a piezoelectric material and a semiconductor device, that is, an IC chip.

JP-A-2006-60638 shows an example of a piezoelectric oscillator. In a quartz crystal oscillator shown in FIG. 1 of JP-A-2006-60638, an IC chip 5 is bonded to a mount substrate 2 with a bump 6 therebetween. A piezoelectric resonator 1 is bonded to an external coupling terminal of the IC chip 5 with solder 9 therebetween.

By bonding together the IC chip 5 and piezoelectric resonator 1 in such a manner that these elements overlap each other vertically as described above, there is provided a piezoelectric oscillator (quartz crystal oscillator) that is made compact in the horizontal direction and thus has a reduced mount area.

However, in the quartz crystal oscillator described in JP-A-2006-60638, the external coupling terminal of the IC chip 5 bonded to the piezoelectric resonator 1 has a flat structure and a limited bonding area. Accordingly, there occurs a problem that the reliability with respect to the electrical coupling between the IC chip and piezoelectric resonator is reduced. This problem becomes more significant as the IC chip and piezoelectric resonator are made smaller.

SUMMARY

An advantage of the invention is to provide a piezoelectric oscillator that is downsized so that the mount area thereof is reduced and whose reliability with respect to the electrical coupling is improved, and a method for manufacturing the piezoelectric oscillator.

A piezoelectric oscillator according to a first aspect of the invention includes: a piezoelectric resonator including a container, the container containing a piezoelectric resonator element; and a semiconductor device including an oscillation circuit for vibrating the piezoelectric resonator. The semiconductor device is bonded to a surface of the container. The container has an external coupling terminal and a cut-off part, the external coupling terminal being coupled to the semiconductor device, the cut-off part being disposed on a side surface of the container. The external coupling terminal is disposed in an area of the container, the area being opposed to the semiconductor device, and in the cut-off part. The semiconductor device has a coupling terminal on a surface thereof, the surface being opposed to the container. The coupling terminal of the semiconductor device and the external coupling terminal of the container are coupled with a conductive material.

By adopting the above-mentioned configuration, the semiconductor device is disposed on and bonded to the piezoelectric resonator. Thus, the piezoelectric oscillator as a whole is made compact.

Also, the container of the piezoelectric resonator has the external coupling terminal for coupling the container to the semiconductor device. This external coupling terminal is disposed in an area of the container that is opposed to the semiconductor device when the semiconductor device is bonded to the container, and is also disposed in the cut-off part connected to the area and formed on the outer surface of the container.

Thus, when solder or a conductive adhesive for bonding is applied to the external coupling terminal of the container, the solder or conductive adhesive extends to the cut-off part, that is, a castellation so that a solder fillet or the like is formed. As a result, the bonding between the container of the piezoelectric resonator element and semiconductor device is strengthened so that the electrical coupling therebetween is ensured.

In the piezoelectric oscillator according to the first aspect of the invention, the container preferably may have a plurality of the external coupling terminal and a concave part is preferably provided between the external coupling terminals in the area of the container.

By adopting the above-mentioned configuration, the concave part is provided between the external coupling terminals of the container. Thus, a sealing resin for sealing gaps between the semiconductor devices flows into the concave part thereby increasing the bonding area. As a result, the bonding strength is further improved.

The "concave part" may take any form such as a "recess," a "groove," or a "slit" as long as the concave part is a concave part into which a sealing resin for sealing gaps between the semiconductor devices can flow.

In the piezoelectric oscillator according to the first aspect of the invention, an outer surface of the semiconductor device is preferably a slope that is gradually inclined inwardly of the semiconductor device as the slope descends.

By adopting the above-mentioned configuration, the slope is used as the outer surface of the semiconductor device so that the area of the semiconductor device bonded to the conductive adhesive or solder is increased. As a result, the bonging strength is further improved.

In the piezoelectric oscillator according to the first aspect of the invention, the piezoelectric resonator preferably includes first and second substrates both made of quartz crystal, and a third substrate that is made of quartz crystal and includes the piezoelectric resonator element and a frame bonded to the first and second substrates that are integrated with each other.

By adopting the above-mentioned configuration, an identical material is used as the materials of the resonator element and the container of the resonator element. Therefore, these elements have an identical linear expansion coefficient. As a result, stress caused by a temperature change other than stress caused by a reflow at the time of mounting is prevented from acting on the frame bonded to the first and second substrates.

In the piezoelectric oscillator according to the first aspect of the invention, the piezoelectric resonator element is preferably an inverted-mesa-type resonator element.

By adopting the above-mentioned configuration, the inverted-mesa-type resonator element is formed inside the frame interposed between the first and second substrates. This is advantageous in that when the resonator element is excited, the first and second substrates 33 and 34 make no contact with the resonator element so as not to prevent the excitation of the resonator element and that flat substrates that have not been subjected to special processing such as formation of a concave part on a side of each substrate facing the resonator element are used as the first and second substrates.

A method for manufacturing a piezoelectric oscillator according to a second aspect of the invention includes: (a) preparing an upper substrate, a lower substrate, and a resonator element substrate; (b) forming a plurality of cut-off parts on the upper substrate; (c) processing shapes of the upper substrate, the lower substrate, and the resonator element substrate; (d) forming an electrode film; (e) bonding together the upper substrate, the lower substrate, and the resonator element substrate in layers; (f) bonding a plurality of semiconductor devices onto the upper substrate after step (e); and (g) cutting out a plurality of piezoelectric oscillators from the multilayered substrates.

By adopting the above-mentioned method, the upper substrate, lower substrate, and resonator element substrate each have a size from which multiple piezoelectric oscillators can be cut out, and the lower substrate and resonator element substrate are also subjected to necessary shape-processing and electrode-film-forming steps. Thus, the processes for forming multiple piezoelectric oscillators are simultaneously performed so that the manufacturing efficiency is enhanced.

Also, multiple cut-off parts necessary for the size of each product are formed on the upper substrate. Subsequently, when solder or a conductive adhesive for bonding is applied to the external coupling terminal of the container, the solder or conductive adhesive extends to the cut-off parts, that is, castellations so that solder fillets are formed. As a result, the bonding between the container of the piezoelectric resonator element and the semiconductor device is strengthened so that the electrical coupling therebetween is ensured.

Also, after bonding together at least three substrates in layers, the semiconductor device bonding process for bonding multiple semiconductor devices onto the upper substrate is performed. Thus, the semiconductor device bonding work corresponding to multiple piezoelectric oscillators is simultaneously performed so that the manufacturing efficiency is enhanced.

BRIEF DESCRIPTION OF THE DRAWINGS

The invention will be described with reference to the accompanying drawings, wherein like reference numerals designate like elements.

DESCRIPTION OF EXEMPLARY EMBODIMENTS

Figure 1:
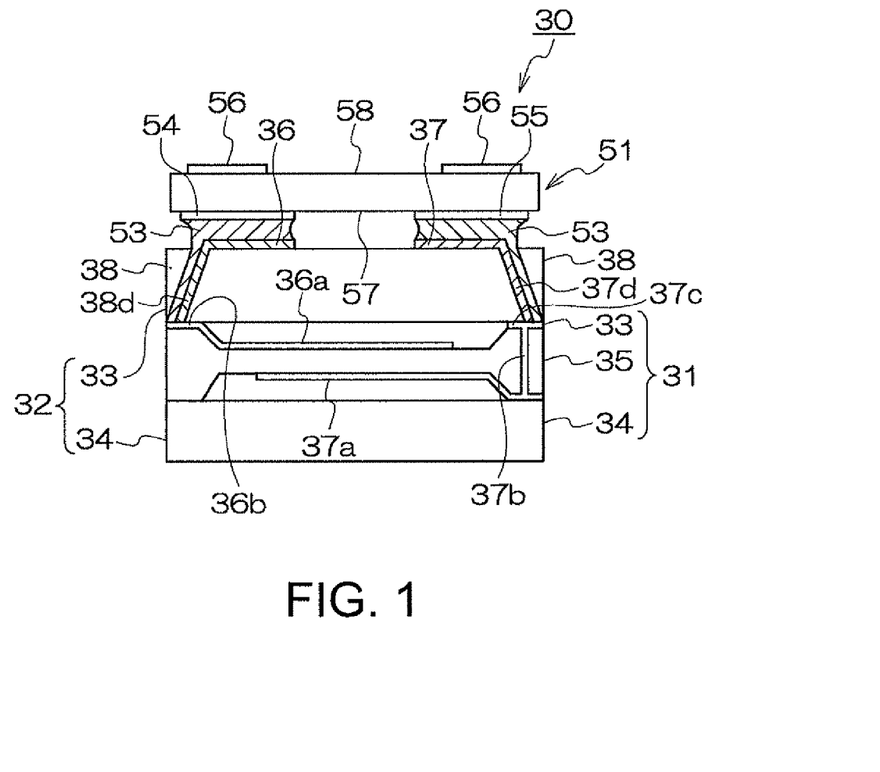
FIG. 1 is a schematic sectional view showing a piezoelectric oscillator according to a first embodiment of the invention.
Figure 2:
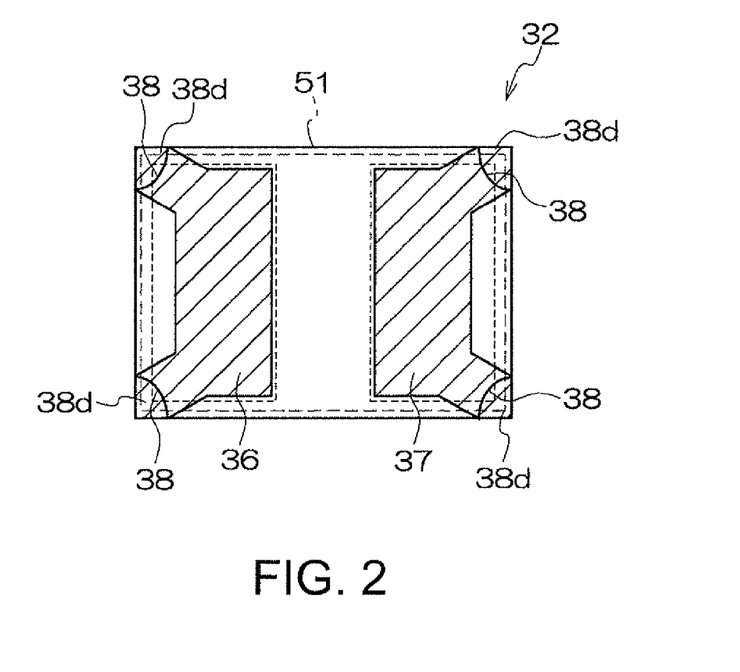
FIG. 2 is a top view (plan view) of a package of the piezoelectric oscillator shown in FIG. 1.

FIG. 1 is a schematic sectional view showing a piezoelectric oscillator according to a first embodiment of the invention. FIG. 2 is a top view (plan view) of a package serving as a container. As shown in FIG. 1, a piezoelectric oscillator 30 is formed by bonding together a piezoelectric resonator 31 and a semiconductor device 51 including an oscillation circuit for vibrating a piezoelectric resonator element 35 contained in a package 32 of the piezoelectric resonator 31.

As shown in FIG. 1, the piezoelectric resonator 31 according to this embodiment includes the package 32 including first and second substrates 33 and 34 and serving as a container, and the piezoelectric resonator element 35 interposed and fixed between these substrates.

The first and second substrates 33 and 34 are preferably light-transmissive, flat plates that are made of glass, more preferably, a material identical to that of the piezoelectric resonator element 35. In other words, the first and second substrates 33 and 34 according to this embodiment are preferably both made of quartz crystal.

The piezoelectric resonator element 35 is made of a piezoelectric material. For example, quartz crystal is used as the piezoelectric material in this embodiment. Other piezoelectric materials such as lithium tantalate and lithium niobate may be used.

Also, the piezoelectric resonator element 35 is an inverted-mesa, AT-cut resonator element and includes an excitation area that is formed by reducing the thickness of the central part of a rectangular quartz crystal plate by etching while leaving the thickness of the periphery of the quartz crystal plate intact and serves as a resonator element body 39. The piezoelectric resonator element may be other types of resonator elements such as a non-inverted-mesa, rectangular resonator element (a case where concave parts are formed inside the first and second substrates so that the resonator element is excited) and a tuning fork-type resonator element.

If an inverted-mesa, AT-cut resonator element is used as the piezoelectric resonator element 35 like in this embodiment, the first and second substrates 33 and 34 make no contact with the resonator element so as not to prevent the excitation of the resonator element, even if the illustrated flat substrates that have not been subjected to special processing such as formation of a concave part on a side of each substrate facing the resonator element are used as the first and second substrates 33 and 34.

The first and second substrates 33 and 34 are bonded together with the piezoelectric resonator element 35 therebetween. Such bonding can be performed using various bonding methods. For example, so-called "direct bonding," in which activated surfaces are generated by applying plasma to bonding surfaces, or alloy bonding using gold and tin may be used to bond together the first and second substrates 33 and 34 and piezoelectric resonator element 35. If the first and second substrates 33 and 34 are made of glass, anodic bonding may be used.

Excitation electrodes 36a and 37a are formed on the front and back surfaces, respectively, of the excitation area of the piezoelectric resonator element 35 by chrome/gold plating or the like.

In FIG. 1, the excitation electrode 36a is extended from the upper surface of the resonator element body to the upper surface of a frame of the piezoelectric resonator element 35 in the form of a conductive pattern. The extended part is a conductive part 36b. The excitation electrode 37a is routed from the lower surface of the resonator element body to the lower surface of the frame of the piezoelectric resonator element 35 in the form of a conductive pattern, and is further extended over a notch side surface formed on the frame and the like in the vertical direction so that a conductive pattern 37b is formed. The end of the extension of the excitation electrode 37a is extended to the upper surface of the frame so that a conductive part 37c is formed.

As shown FIG. 2, the first substrate 33 of the package 32 serving a container is a rectangular substrate. Castellations 38, which are cut-off parts or missing parts, are formed in the four corners of the first substrate 33 using a technique such as dry etching or sand blast. In this case, each castellation 33 has a slope that is gradually inclined outward as the slope descends.

As is understood from FIGS. 1 and 2, external coupling terminals 36 and 37 connected to the above-mentioned conductive parts 36b and 37c, respectively, formed on the surface of the frame are formed on the upper surface of the first substrate 33.

Specifically, the external coupling terminals 36 and 37 are provided on the upper surface of the first substrate 33 in positions immediately below terminals of the semiconductor device 51 that are coupled to the external coupling terminals 36 and 37 and provided, for example, by forming through electrodes to be described later. Also, the external coupling terminals 36 and 37 are extended as conductive patterns 38d along the slopes of the above-mentioned cut-off parts 38 of the first substrate 33 included in the package 32 to the lower surface of the first substrate 33 so that the external coupling terminals 36 and 37 are connected to the conductive parts 36b and 37c, respectively, formed on the frame surface.

The semiconductor device 51 is a so-called IC chip. Specifically, the semiconductor apparatus 51 is a semiconductor element including an oscillation circuit and a temperature compensation circuit for use in the piezoelectric resonator 31 and has a function of compensating for the frequency variation of the piezoelectric resonator 31 according to the piezoelectric oscillator's temperature.

In FIG. 1, the upper surface of the semiconductor device 51 is an active surface 58 and the lower surface thereof is a non-active surface 57. As shown, external coupling terminals 56 are formed on the active surface 58 of the semiconductor device 51. The external coupling terminals 56 are used as mount terminals. In this embodiment, the external coupling terminals 56 are, for example, pre-coated with solder for mounting.

On the other hand, coupling terminals 54 and 55 coupled to the active surface 58 are formed on the non-active surface 57 of the semiconductor device 51. The coupling terminals 54 and 55, that is, through electrodes pass through a silicon substrate forming the semiconductor device 51 so as to electrically couple the front and back surfaces of the silicon substrate.

A method for forming the coupling terminals 54 and 55 will be simply described. First, an insulating layer made of silicon oxide is formed on the whole surface of the above-mentioned silicon substrate by thermal oxidation or the like. Then, a resist is applied onto the insulating layer and patterned into a predetermined shape by performing exposure and development processes. Then, using this resist as a mask, multiple grooves each taking the shape of a circle in a plan view are formed on the silicon substrate by etching. Also, an insulating layer for covering the inner wall surface of each groove is formed by thermal oxidation or the like. Then, a base layer is formed on the inner surface of each groove, that is, on the active surface of the silicon substrate including the inner wall surface by sputtering, vacuum deposition, or the like.

Subsequently, a plating resist is applied onto the active surface 58 of the silicon substrate and patterned so that the plating resist has openings where areas of the silicon substrate near the above-mentioned grooves are exposed. Thus, a plating resist pattern is formed. Using this plating resist pattern as a mask, Cu electrolytic plating is performed so that copper is deposited inside the grooves including the above-mentioned openings. Thus, the grooves are filled with copper so that metal terminals are formed in the openings including the grooves. Then, using the plating resist pattern as a mask as it is, a bonding material made of a brazing material such as lead-free solder is formed on the metal terminals.

Subsequently, the plating resist pattern is eliminated from the silicon substrate. Then, the silicon substrate is back-grinded from the back surface thereof so that the metal terminals are exposed on the back surface of the silicon substrate. Thus, the coupling terminals 54 and 55 that are multiple through electrodes made of the metal terminals and bonding material are formed. This allows the semiconductor device 51 to control the drive of the piezoelectric resonator element 35 via the coupling terminals 54 and 55. Note that the semiconductor device 51 except for areas thereof where the coupling terminals 54 and 55 and the mount terminals 56 are exposed is insulated using, e.g., polyimide.

Also, in this embodiment, a conductive adhesive or pieces of solder 53 is applied to the external coupling terminals 36 and 37 of the piezoelectric resonator 31. Then, the semiconductor device 51 is placed on the conductive adhesive or pieces of solder 53 in a polymeric manner and then the conductive adhesive or solder 53 is hardened. Here, pieces of solder having a higher melting point than that of the solder with which the mount terminals 56 of the semiconductor device 51 have been pre-coated are used as the pieces of solder 53. This is intended to prevent separation of the bonded piezoelectric resonator 31 and semiconductor device 51 in a reflow process performed when mounting the piezoelectric oscillator 30.

Also, the mount terminals 56 of the semiconductor device 51 may be exposed and other parts of the semiconductor device 51 may be resin-molded. Thus, the semiconductor device 51 is protected from the moisture and the like in the air. In this case, the mold resin may be a normal semiconductor sealing resin such as an epoxy resin.

The piezoelectric oscillator according to this embodiment is configured as described above. As shown in FIG. 1, the piezoelectric oscillator is formed by disposing the semiconductor device 51 on the piezoelectric resonator 31 and then bonding these elements together. Thus, the piezoelectric oscillator as a whole is made compact.

Also, the package 32 serving as a container of the piezoelectric resonator 31 has the external coupling terminals 36 and 37, which include areas opposed to the semiconductor device 51 and also include the parts 37d and 38d, respectively, connected to these areas and extending over the cut-off parts 38 formed on the first substrate 33.

Therefore, when the pieces of solder 53 or a conductive adhesive are applied to the external coupling terminals 36 and 37 of the package 32, the solder or conductive adhesive enters the cut-off parts of the package 32, that is, the castellations 38 so that, for example, solder fillets are formed. As a result, the bonding between the container 32 of the piezoelectric resonator element and the semiconductor device 51 is strengthened so that electrical coupling therebetween is ensured.

Figure 3:
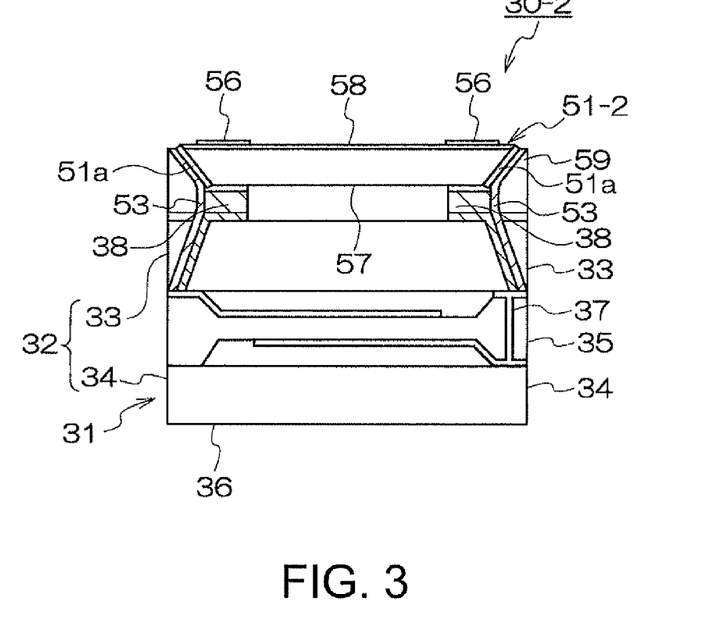
FIG. 3 is a schematic sectional view showing a piezoelectric oscillator according to a second embodiment of the invention.

FIG. 3 is a schematic sectional view showing a piezoelectric oscillator according to a second embodiment of the invention. Elements common to FIG. 3 and FIGS. 1 and 2 are assigned same reference numerals and will not be described again. The difference between these drawings will be mainly described.

The difference between a piezoelectric oscillator 30-2 according to this embodiment and the piezoelectric oscillator 30 according to the first embodiment is the configuration of a semiconductor device 51-2. As shown in FIG. 3, the outer surface of the semiconductor device 51-2 according to this embodiment is a slope 51a that is gradually inclined inwardly of the semiconductor apparatus as the slope descends.

The piezoelectric oscillator according to this embodiment is configured as described above. Since the outer surface of the semiconductor device 51-2 is the slope 51a, the areas of the semiconductor device 51-2 that are bonded to a conductive adhesive or the pieces of solder 53 are increased so that the bonding strength is further improved. Other effects and advantages of this embodiment are the same as those of the first embodiment.

Figure 4:
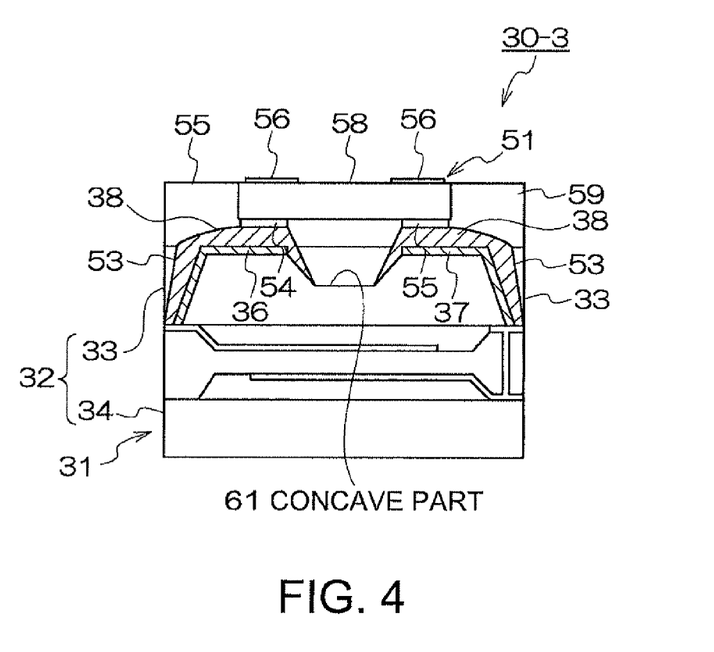
FIG. 4 is a schematic sectional view showing a piezoelectric oscillator according to a third embodiment of the invention.
Figure 5:
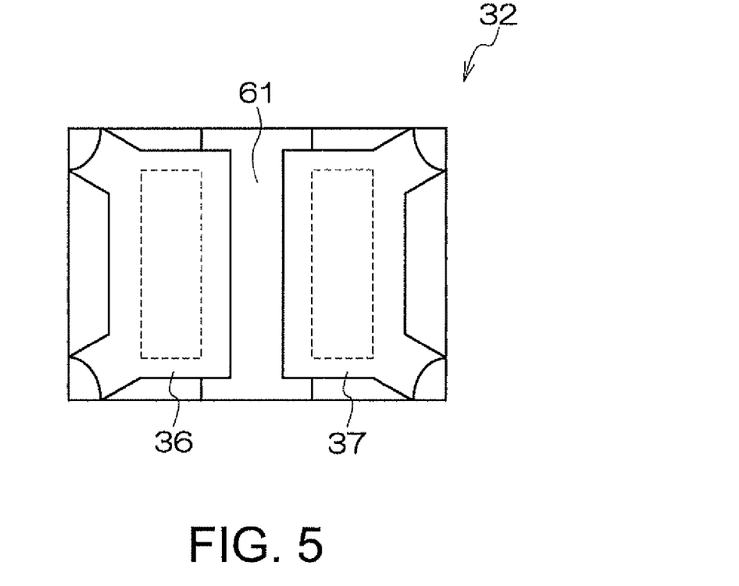
FIG. 5 shows a top view (plan view) of a package of the piezoelectric oscillator shown in FIG. 4.
Figure 6:
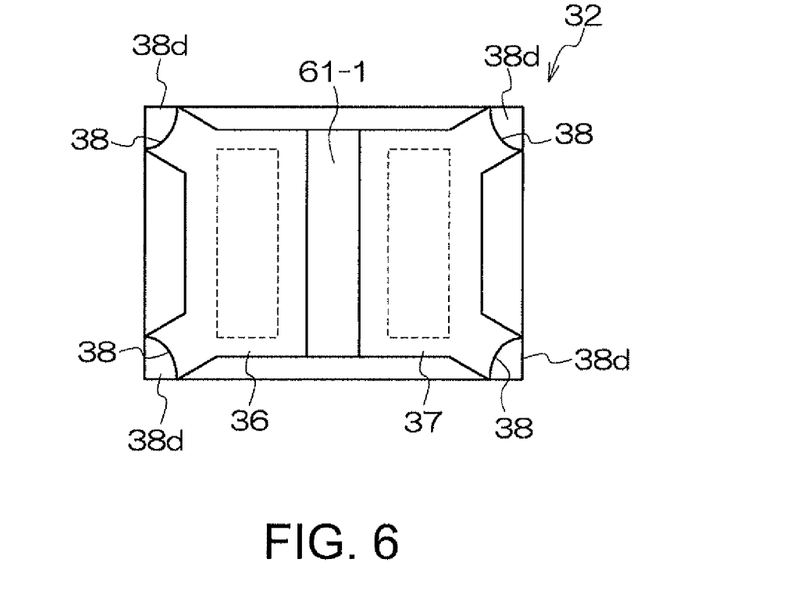
FIG. 6 shows a top view (plan view) of the package of the piezoelectric oscillator shown in FIG. 4.

FIG. 4 is a schematic sectional view showing a piezoelectric oscillator according to a third embodiment of the invention. FIGS. 5 and 6 are top views of a package serving as a container of a piezoelectric resonator. Elements common to FIGS. 4 to 6 and FIGS. 1 and 2 are assigned same reference numerals and will not be described again. The difference between these drawings will be mainly described.

This embodiment is an example in which the external dimensions of a semiconductor device are made smaller than those of the package.

In this embodiment, a concave part 61 is provided between the external coupling terminals 36 and 37 that are multiple external coupling terminals provided on the first substrate 33 of the package 32. The concave part 61 is formed on the upper surface of the first substrate 33 opposed to the semiconductor device 51. FIG. 5 shows a top view (plan view) of the package 32. The concave part 61 may take various forms. In this embodiment, the concave part 61 is a groove extending in the depth direction of FIG. 4, and the edges of the groove is wider than the middle part thereof as shown in FIG. 5.

On the other hand, the edges of a groove 61-1 shown in FIG. 6, which is a concave part, have the same width as that of the middle part thereof. The concave part is not limited to a groove as described above and may be a hole-shaped recess, multiple slits, or the like.

The piezoelectric oscillator according to this embodiment is configured as described above. Since a conductive adhesive or pieces of solder 53 flows into the concave part as shown in FIG. 4, solder fillets are apt to occur also inside the coupling terminals 54 and 55 of the semiconductor device 51. As a result, the bonding area is increased so that the bonding strength is improved.

Also, since the concave part is made between the external coupling terminals 36 and 37 while increasing the bonding areas between the external coupling terminals 36 and 37 and the coupling terminals 54 and 55, respectively, the solder or the like is prevented from making contact with these coupling terminals. As a result, the terminals are reliably insulated from each other. Other effects and advantages of this embodiment are the same as those of the first embodiment.

Method for Manufacturing Piezoelectric Oscillator

Shape Processing Step

Figure 7:
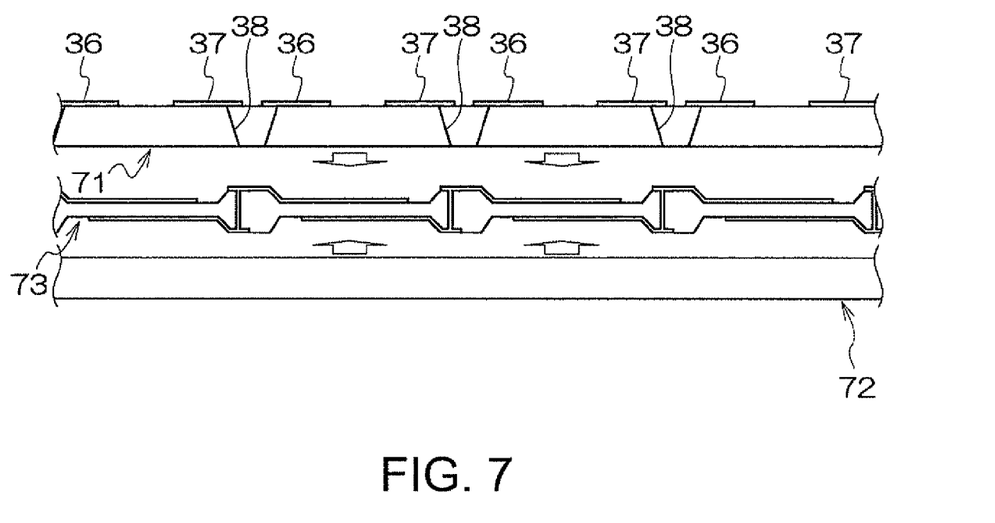
FIG. 7 is a process drawing relating to a method for manufacturing the piezoelectric oscillator shown in FIG. 1.

As shown in FIG. 7, three substrates are prepared. Specifically, an upper substrate 71, a lower substrate 72, and a resonator element substrate 73 interposed and fixed between the upper substrate 71 and lower substrate 72 are prepared. These substrates have same external dimensions. Substrate wafers having a size from which multiple piezoelectric oscillators 30 (see FIG. 1) can be cut out in the vertical and horizontal directions are used as such substrates.

Among the three substrate wafers, at least the upper substrate 71 must be light-transmissive. For example, the upper substrate 71 and lower substrate 72 may be glass wafers. Or, the three substrate wafers may be all made of quartz crystal. If same quartz crystal wafers are used as the three substrates, the linear expansion coefficients of all the substrates match one another after the substrates are bonded together. This is preferable because warpage or the like is prevented from occurring in the substrates due to a change in the environmental temperature and thus the frequency is prevented from being shifted due to the act of distortion stress on the resonator element.

As for the three substrate wafers, shape processing is performed on each substrate wafer. As for the upper substrate 71, cut-off parts 38 is provided by making circular holes in the four corners of each of areas of the upper substrate 71 arranged in the vertical and horizontal directions, from which products (piezoelectric oscillators) are to be cut out, using a technique such as dry etching in such a manner that each hole extends over the adjacent corners of the adjacent areas.

As described above, the resonator element substrate 73 is subjected to etching so that an excitation area serving as an inverted-mesa resonator element is formed. Since the etching is simultaneously performed on the whole resonator element substrate 73, two or more or many excitation areas are simultaneously formed.

Electrode Film Forming Step

Next, the excitation electrodes or external coupling terminals are formed on each substrate, for example, first, forming a chrome layer on the substrate, then forming a gold layer on the chrome layer, and then conducting photolithography. Thus, the excitation electrodes and external coupling terminals shown in FIG. 1 are formed (bonding step).

Next, as shown by arrows in FIG. 7, three substrates are bonded together in layers using a bonding method suitable for the material of the substrates as above-mentioned in such a manner that the resonator element substrate 73 is interposed between the upper substrate 71 and lower substrate 72.

Semiconductor Device Bonding Step

Figure 8:
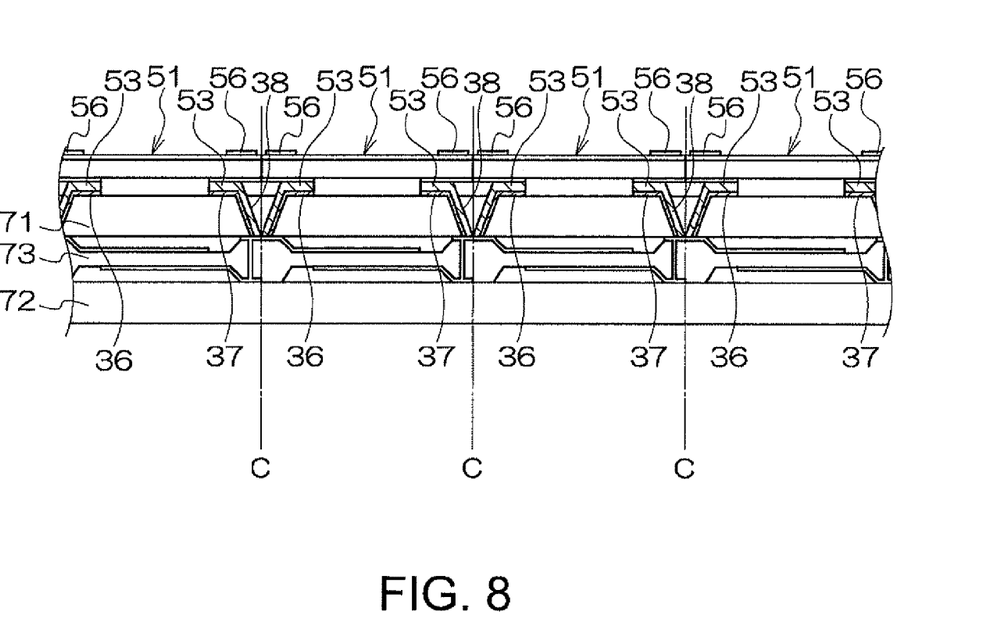
FIG. 8 is a process drawing relating to the method for manufacturing the piezoelectric oscillator shown in FIG. 1.

Next, as shown in FIG. 8, the pieces of solder 53 are applied to the external coupling terminals 36 and 37 of the upper substrate 71, then the prepared semiconductor devices 51 are placed on the pieces of solder 53, and then a step of causing the pieces of solder 53 to reflow is performed. Thus, two or more or many semiconductor devices 51 are simultaneously bonded to the wafer-shaped upper substrate 71.

At that time, the pieces of solder 53 extend to the cut-off parts 38 so that each bonding area is increased and thus solder fillets are properly formed. Subsequently, gaps between the semiconductor devices 51 on the upper substrate 71 are resin-sealed using, for example, an epoxy resin.

Separation Step

Subsequently, as shown by dotted lines C in FIG. 8, the piezoelectric oscillator 30 shown in FIG. 1 is obtained in a great number by cutting the substrates at the positions defining individual products.

As is understood from the above description, if this embodiment is adopted, the processes for forming multiple piezoelectric oscillators 30 are simultaneously performed so that the manufacturing efficiency is enhanced.

Also, the multiple cut-off parts 38 necessary for the size of each product are simultaneously formed on the upper substrate 71. Subsequently, when the pieces of solder 53 are applied, the pieces of solder 53 extend to the cut-off parts 38 so that solder fillets are formed. As a result, the bonding between the package 32 and semiconductor device 51 is strengthened so that the electrical coupling therebetween is ensured.

Also, after the three substrates are bonded together in layers, the semiconductor device bonding process for bonding multiple semiconductor devices 51 to the upper substrate 71 is performed. Thus, the semiconductor devices 51 are efficiently bonded.

Figure 9:
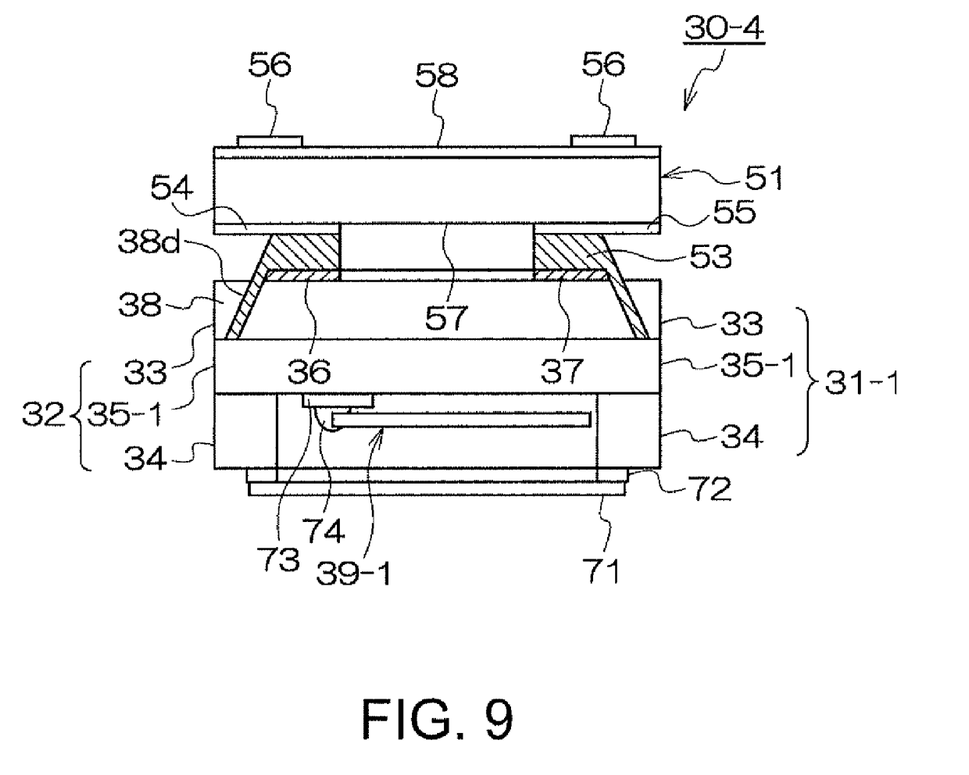
FIG. 9 is a schematic sectional view showing a piezoelectric oscillator according to a fourth embodiment of the invention.

FIG. 9 is a schematic sectional view showing a piezoelectric oscillator according to a fourth embodiment of the invention. Elements common to FIG. 9 and FIGS. 1 and 2 are assigned same reference numerals and will not be described again. The difference between these drawings will be mainly described.

In this embodiment, the configuration of the package 32 serving as a container of the piezoelectric resonator 31-1 is different from that according to the first embodiment and the configurations of other elements are the same as those according to the first embodiment.

A second substrate 35-1 of the piezoelectric resonator 31-1 is a substrate for forming a package and does not include a piezoelectric resonator element. A piezoelectric resonator element 39-1 is bonded to an electrode part 73 formed on the lower surface of the second substrate 35-1 in FIG. 9 using a conductive adhesive 74 in a cantilever manner. The electrode part 73 is coupled to the external coupling terminals 36 and 37, which are mount terminals of the piezoelectric resonator 31-1, via a conductive through hole passing through the package 32, a conductive pattern routed through a castellation, or the like (not shown).

The piezoelectric oscillator according to this embodiment is configured as described above and the structure of the piezoelectric resonator 31-1 is different from that according to the first embodiment. However, the structure of the bonding between the piezoelectric resonator 31-1 and semiconductor device 51 is the same as that according to the first embodiment and the same effects and advantages are obtained.

The invention is not limited to the above-mentioned embodiments and the elements of the embodiments may be combined with each other as appropriate or may be combined with not-shown other elements. The shape of the piezoelectric resonator element is not limited to the illustrated shapes. The piezoelectric resonator element may take various forms such as a rectangular piezoelectric resonator element and a tuning fork-shaped piezoelectric resonator element.

The entire disclosure of Japanese Patent Application Nos: 2007-322920, filed Dec. 14, 2007 and 2008-270607, filed Oct. 21, 2008 are expressly incorporated by reference herein.

What is claimed is:

1. A piezoelectric oscillator comprising:
  a piezoelectric resonator including a container, the container containing a piezoelectric resonator element; and
  a semiconductor device including an oscillation circuit for vibrating the piezoelectric resonator, wherein:
    the semiconductor device is bonded directly to a surface of the container;
    the container has an external coupling terminal and a cut-off part, the external coupling terminal being coupled to the semiconductor device, the cut-off part being disposed on a side surface of the container and has a slope that is gradually inclined;
    the external coupling terminal is disposed in an area of the container, the area being opposed to the semiconductor device, and the external coupling terminal extends as a conductive pattern along a side surface of the entire cut-off part;
    the semiconductor device has a coupling terminal on a surface thereof, the surface being opposed to the container; and
    the coupling terminal of the semiconductor device and the external coupling terminal of the container are coupled with a conductive material, the conductive material extends along the side surface of the cut-off part.

2. The piezoelectric oscillator according to claim 1, wherein
  the container has a plurality of the external coupling terminals and a concave part is provided between the external coupling terminals in the area of the container.

3. The piezoelectric oscillator according to claim 2, wherein the concave part is formed as a groove in an upper surface of the container, the upper surface of the container being opposed to the semiconductor device.

4. The piezoelectric oscillator according to claim 3, wherein the conductive material extends into the concave part and contacts the upper surface of the container.

5. The piezoelectric oscillator according to claim 1, wherein
  an outer surface of the semiconductor device is a slope that is gradually inclined inwardly of the semiconductor device as the slope descends.

6. The piezoelectric oscillator according to claim 1, wherein
  the piezoelectric resonator includes first and second substrates both made of quartz crystal, and a third substrate that is made of quartz crystal and includes the piezoelectric resonator element and a frame bonded to the first and second substrates, the piezoelectric resonator and the frame being integrated with each other.

7. The piezoelectric oscillator according to claim 6, wherein
  the piezoelectric resonator element is an inverted-mesa-type resonator element.

8. A method for manufacturing a piezoelectric oscillator, comprising:
  (a) preparing an upper substrate, a lower substrate, and a resonator element substrate;
  (b) forming a plurality of cut-off parts on the upper substrate;
  (c) processing shapes of the upper substrate, the lower substrate, and the resonator element substrate;
  (d) forming an electrode film;
  (e) bonding together the upper substrate, the lower substrate, and the resonator element substrate in layers;
  (f) bonding a plurality of semiconductor devices onto the upper substrate after step (e); and
  (g) cutting out a plurality of piezoelectric oscillators from the multilayered substrates.

* * * * *